United States Patent
Kim et al.

(12) 
(10) Patent No.: US 6,465,356 B2
(45) Date of Patent: Oct. 15, 2002

(54) METHOD FOR FORMING FINE PATTERNS BY THINNING DEVELOPED PHOTORESIST PATTERNS USING OXYGEN RADICALS

(75) Inventors: Gi-Hyeon Kim; Sang-Soo Park, both of Ichon-shi (KR)

(73) Assignee: Hyundai Electronics Industries Co., Ltd., Kyungki-do (KR)

(*) Notice: Subject to any disclaimer, the term of this patent is extended or adjusted under 35 U.S.C. 154(b) by 0 days.

(21) Appl. No.: 09/894,155

(22) Filed: Jun. 27, 2001

(65) Prior Publication Data

US 2002/0001957 A1 Jan. 3, 2002

(30) Foreign Application Priority Data

Jun. 28, 2000 (KR) ........................................ 2000-35969

(51) Int. Cl.$^7$ .......................... H01L 21/311; G03C 5/00
(52) U.S. Cl. ...................... 438/694; 438/708; 430/313; 430/329
(58) Field of Search ............................ 438/3, 708, 694; 430/329, 330, 314, 316, 323, 296, 325, 328, 394, 942, 313

(56) References Cited

U.S. PATENT DOCUMENTS

| | | | | |
|---|---|---|---|---|
| 4,806,456 A | * | 2/1989 | Katoh | .......................... 430/296 |
| 5,876,901 A | * | 3/1999 | Ishimaru | ..................... 430/296 |
| 6,316,169 B1 | * | 11/2001 | Vahedi et al. | ............... 430/329 |
| 2001/0050386 A1 | * | 12/2001 | Suzuki et al. | ............... 257/296 |

OTHER PUBLICATIONS

Ghandi, Sorab,; "VLSI Fabrication Principles–Silicon and Galium Arsenide"; 1994 by John Wiley & Sons Inc.; Second Edition; pp. 664–669, 673–676 and 685–687.*

* cited by examiner

*Primary Examiner*—Olik Chaudhuri
*Assistant Examiner*—Timothy Sutton
(74) *Attorney, Agent, or Firm*—Marshall, Gerstein & Borun

(57) ABSTRACT

The present invention relates to a method for fabricating a semiconductor device; and, more particularly, to a photoresist pattern to form a fine line width of about 0.1 μm or less. A method for forming fine photoresist patterns according to the present invention comprises the step of: forming photoresist patterns over a semiconductor substrate using a stepper; and ashing the photoresist patterns using oxygen radicals in order to decrease line width of the photoresist patterns. The oxygen radicals are formed by a thermal decomposition of an ozone gas in an ozone asher. Accordingly, the present invention overcomes the resolution of the stepper by controlling the ashing rate at a low temperature using the oxygen radicals in the ozone asher.

15 Claims, 5 Drawing Sheets

BEFORE ASHING

ASHING(1minute)

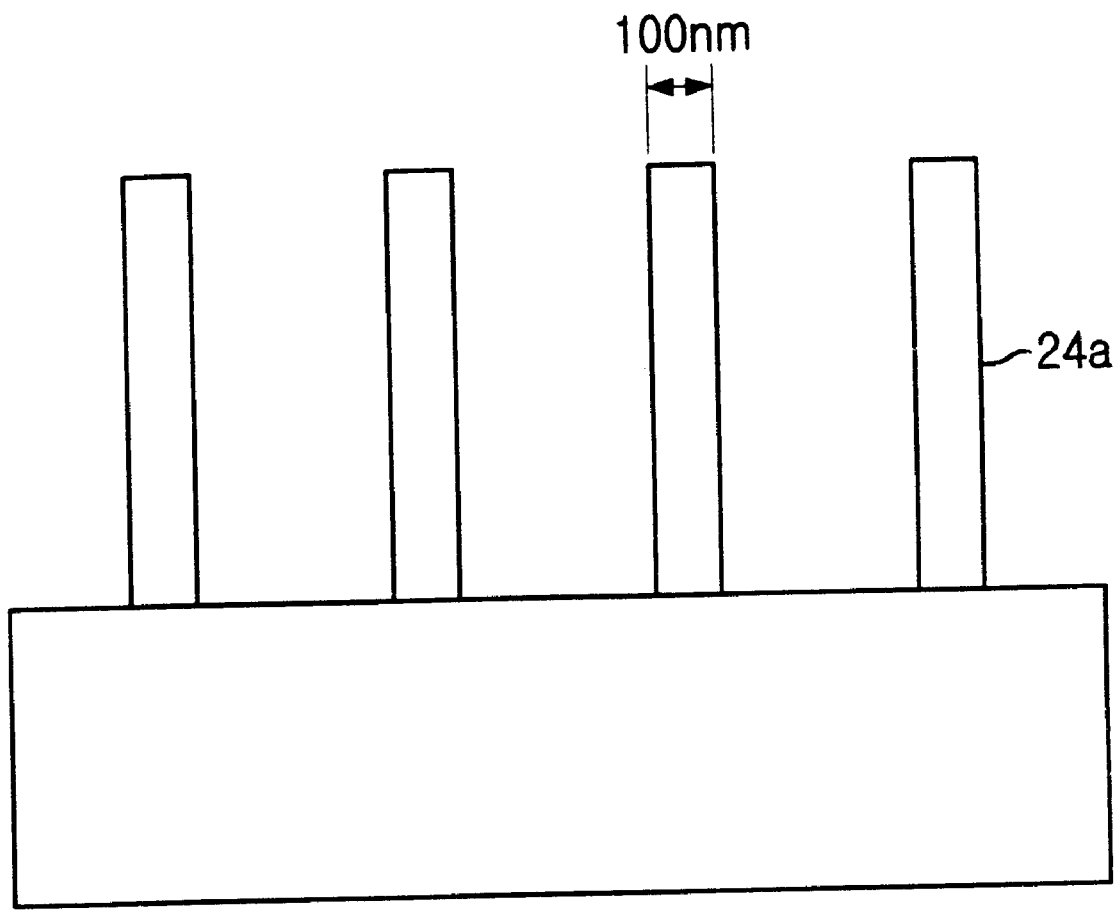

METHOD FOR FORMING FINE PATTERNS BY THINNING DEVELOPED PHOTORESIST PATTERNS USING OXYGEN RADICALS

FIELD OF THE INVENTION

The present invention relates to a method for fabricating a semiconductor device; and, more particularly, to a method for fabricating fine photoresist pattern to form a fine line width of about 0.1 µm or less.

DESCRIPTION OF THE PRIOR ART

Generally, with the development of highly integrated circuits, the minimum feature size required to manufacture a semiconductor device has become increasingly smaller and line width has depended on the resolution of step-and-repeat projection equipment (stepper). The resolution of the current stepper may form a line width of 0.28 µm when the i-line of 365 nm-wavelength is applied to the lithography process. In case of DUV (Deep Ultra Violet) of 275 nm-wavelength, the stepper may form a line width of 0.18 µm.

The stepper has employed a DUV light source from KrF-Excimer laser generating 248 nm-wavelength light or a scanning method has been employed.

As of now, although many techniques are combined in order to increase of the resolution in the DUV-Lithography process, it is impossible to form a fine pattern of 0.1 µm or less. Accordingly, new light sources such as electron beam, X-ray and EUV (Extreme Ultra Violet), have been developed.

However, the lithography process using the electron beam is not suitable to increase the throughput of semiconductor devices and, in case of the X-ray, there are many problems to be solved in connection with masks, arrangement, resist materials and the yield of devices.

On the other hand, photoresist patterns have been removed by plasma that is generated from the RF or microwave equipment. That is, the photoresist layers are removed by the chemical reaction on ions or radicals in the plasma, which physically strike against the components in the photoresist patterns.

However, this photoresist removing method involves a physical method, in which the ion and radical collisions are employed, and an additional chemical method. As a result, this methodology may cause an exposed semiconductor substrate or other layers formed on the semiconductor substrate to be damaged because many layers are exposed between the photoresist patterns. Also, heavy metal ions such as Na+ infiltrate into the semiconductor layer together with plasma components, causing the semiconductor layer to be seriously damaged. Frequently, this seriously damaged semiconductor layer results in the devices being discarded.

FIGS. 1A and 1B are cross-sectional views illustrating a prior art method for forming photoresist patterns.

Referring to FIG. 1A, a conducting layer 12 is formed on a semiconductor substrate 11 and an ARC (Anti-Reflective Coating) layer 13 is formed on the conducting layer 12. Photoresist patterns 14 are formed on the ARC layer 13 using a KrF-Excimer laser stepper. The photoresist patterns 14 are formed at a constant distance (S) and height (H) and in a constant width (W). Typically, the photoresist patterns 14 may have a width of 170nm in the KrF-Excimer laser stepper.

Referring to FIG. 1B, final fine patterns are formed by developing the photoresist patterns 14 to which the exposure process has been applied. However, in case where the ratio for the height to the width of each photoresist pattern 14 is in excess of four, the photoresist patterns 14 may collapse after wet-treating the photoresist patterns 14 in the developing process. Furthermore, the depth of the photoresist patterns 14 may be decreased at the time of treatment in a plasma asher with their size shift.

SUMMARY OF THE DISCLOSED METHOD AND DEVICE

The disclosed method and device provides a method for forming fine patterns capable of surpassing resolution of a stepper by using a KrF-Excimer laser and an $O_3$-asher in semiconductor fabricating processes.

The disclosed method and device also provides a method for forming fine patterns to guarantee the throughput of devices in semiconductor fabricating processes.

In accordance with one aspect of the present invention, a method for forming fine photoresist patterns in a semiconductor device is provided which comprises forming photoresist patterns over a semiconductor substrate using a stepper; and ashing the photoresist patterns using oxygen radicals in order to decrease line width of the photoresist patterns. In the disclosed method and device, the oxygen radicals are formed by a thermal decomposition of an ozone gas in an ozone asher.

BRIEF DESCRIPTION OF THE DRAWINGS

Other objects and aspects of the disclosed method and device will become apparent from the following description of the embodiments with reference to the accompanying drawings, wherein:

FIGS. 4A to 4C are cross-sectional views showing a line width variation of the photoresist patterns according to the present invention.

DETAILED DESCRIPTION OF THE DISCLOSED METHOD AND DEVICE

Hereinafter, a method for forming fine patterns according to the present invention will described in detail referring the accompanying drawings.

Figure 1A:
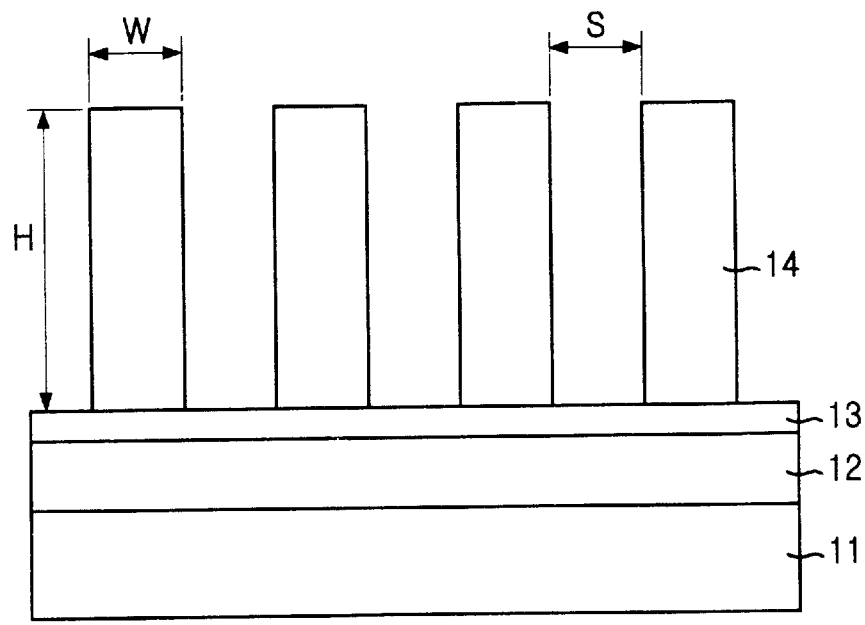
FIGS. 1A and 1B are cross-sectional views illustrating a conventional method for forming photoresist patterns.
Figure 1B:
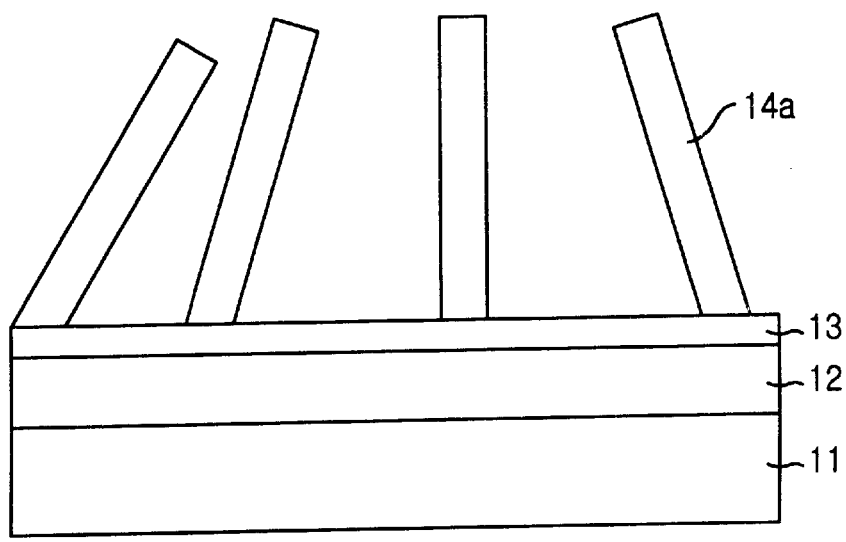
Figure 2A:
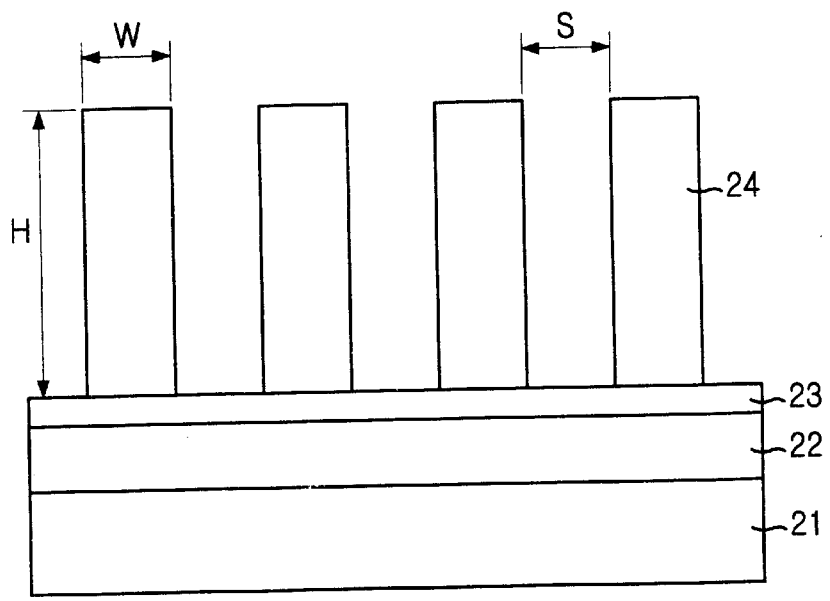
FIG. 2A is a cross-sectional view showing photoresist patterns formed on the basis of resolution of a stepper.

First, referring to FIG. 2A, a conducting layer 22, such as a polysilicon or metal layer, is formed on a semiconductor substrate 21 and an ARC (Anti-Reflective Coating) layer 23 is formed on the conducting layer 22. Photoresist patterns 24 are formed on the ARC layer 23 using a KrF-Excimer laser stepper. At this time, the photoresist patterns 24 may have a width of 170 nm.

Figure 2B:
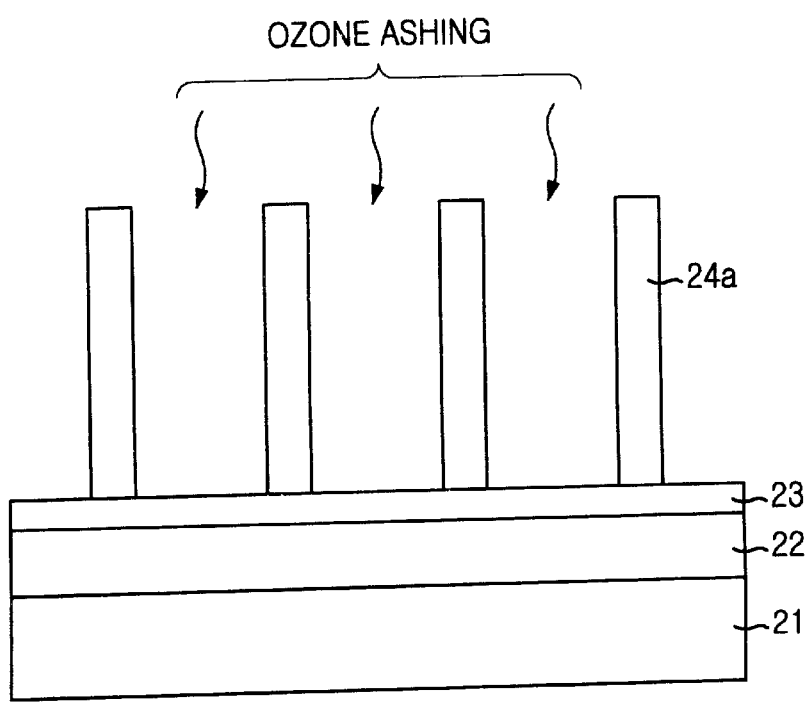
FIG. 2B is a cross-sectional view showing thin photoresist patterns formed by an ozone asher according to the present invention.

Next, referring to FIG. 2B, the photoresist patterns 24 are slimmed by an ozone asher. That is, an ozone gas from an ozone asher are converted into oxygen radicals (O*) and these oxygen radicals make the photoresist patterns 24 thin in an atmosphere pressure and at a low temperature, thereby forming the slimmed photoresist patterns 24a. The ozone asher treats the photoresist pattern 24 at a low temperature ranging from about 130° C. to about 200° C. Since the ozone asher in a low temperature has a low ash rate, it is possible to make the width of the photoresist pattern 24a fine without their falling down. Since an ashing loss in the ozone asher is not caused by an ion-bombardment and charged particles, the lifetime of minority carriers is not influenced by the ozone asher. Also, it is not required to install an additional vacuum chamber because the ashing process is carried out in an atmosphere pressure. The microloading effect, in which an etching rate of the photoresist patterns 24a is decreased by ions vertically moving along the photoresist patterns 24a based on the distribution of ions themselves in a low pressure and microspace, is not generated by the ozone asher.

Figure 3:
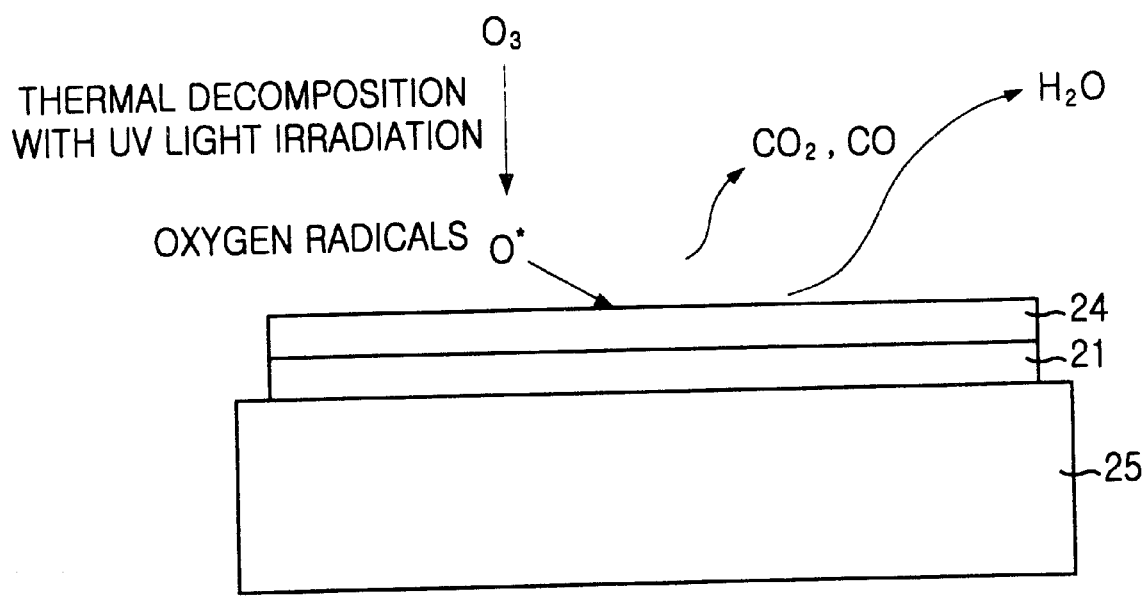
FIG. 3 is a schematic diagram illustrating the use of the ozone asher in order to form fine photoresist patterns according to the present invention.

FIG. 3 is a schematic diagram illustrating the use of the ozone asher in order to form fine photoresist patterns according to the present invention. The ozone asher is well-known to ordinary skilled in the art to which the subject matter pertains in removing the photoresist patterns. In the present invention, such an ozone asher acts as an apparatus to fine, not remove, the photoresist patterns. Accordingly, a method for removing the photoresist patterns through the ozone asher may be illustrated as a method for forming the above-mentioned fine patterns according to the present invention.

Generally, the ozone asher, as an etching apparatus, may remove the photoresist patterns through the chemical reaction of oxygen radicals, which are generated by the thermal decomposition of an ozone gas. That is, the photoresist patterns 24 are composed of a basic C—H—O structure and the C—H—O structure may be easily disconnected when the oxygen radicals (O*) react on the C—H—O structure. Further, since the ozone gas ($O_3$) may be easily converted into oxygen radical components when the temperature of the ozone gas comes to a predetermined temperature, the formation of the oxygen radicals is easily achieved by blowing an ozone gas on a wafer in a sealed-up etching chamber and by heating the wafer through a heat block 25. The converted oxygen radicals do not impact to the photoresist patterns 24 physically, but merely disconnect their bond in the C—H—O structure without any chemical reaction on the components in the photoresist patterns 24.

First, in order to form the fine patterns 24a using the ozone asher, the semiconductor substrate 21 on which the photoresist patterns 24 is formed is mounted on the heater block 25. The ozone gas is provided to the photoresist patterns 24 from a nozzle of the ozone asher and, in preferred embodiment, the ozone gas in the chamber may be maintained at a high concentration ranging from about 5 vol % to about 7 vol %.

Subsequently, when the semiconductor substrate 21 is heated through the heater block 25 under the ultra violet light irradiation, the provided ozone gas undergoes the thermal decomposition and the oxygen radicals are generated by the ultra violet light irradiation.

The oxygen radicals make the photoresist patterns 24 thin and the oxygen radicals are kept straight on the photoresist patterns 24, thereby forming the fine patterns to be employed in the highly integrated circuits. The carbon and hydrogen ions contained in the photoresist patterns 24 react on the oxygen radicals that $CO_2$ and $H_2O$ generated by this reaction migrate away from the photoresist patterns 24 and are exhausted from the ozone asher in order to prevent the contamination of the semiconductor substrate 21.

Figure 4A:
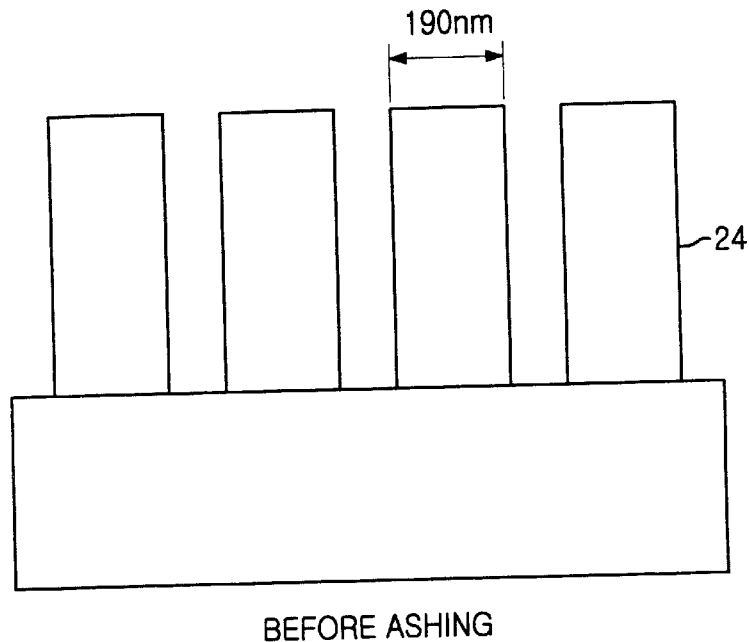
Figure 4B:
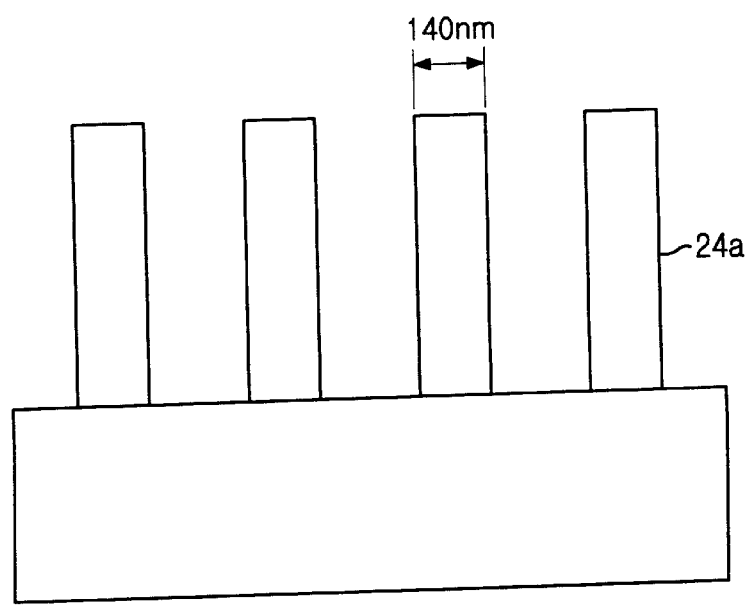

FIGS. 4A to 4C are cross-sectional views showing the variation of line width of the photoresist patterns according to the ashing time. FIG. 4A is a cross-sectional view showing the line width (190 nm) of the photoresist patterns 24 before ashing them, FIG. 4B is a cross-sectional view showing the line width (140 nm) of the photoresist patterns 24a after ashing them for one minute, and FIG. 4C is a cross-sectional view showing the line width (100 nm) of the photoresist patterns 24a after ashing them for two minutes. As shown in FIG. 4C, it should be noted that the photoresist patterns 24a of 100 nm-line width are not fallen down and are formed uniformly over the ashing. Accordingly, considering the temperature and the amount of injected ozone and the ashing time, this ashing rate may be controlled by the required line width.

On the other hand, the photoresist layer may be positive or negative and the above-mentioned ozone ashing may be applied to different light sources, i.e., g-line (436 nm), i-line (365 nm), ArF (193 nm).

As apparent from the above, the disclosed method and device overcome the resolution of the stepper by controlling the ashing rate at a low temperature using the oxygen radicals in the ozone asher. Accordingly, since the fine patterns of 0.1 $\mu$m or less may be easily formed in an atmosphere pressure and at a low temperature, the disclosed method and device may increase the yield of the semiconductor devices.

Although the preferred embodiments of the disclosed method and device have been disclosed for illustrative purpose, those skilled in the art will appreciate that various modifications, additions and substitutes are possible, without departing from the scope and spirit of the disclosed method and device as described in the accompanying claims.

What is claimed is:

1. A method for forming fine photoresist patterns in a semiconductor device comprising the steps of:

forming photoresist patterns over a semiconductor substrate using a stepper; and ashing the photoresist patterns with oxygen radicals by heating the substrate and photoresist patterns in a chamber and supplying ozone gas and ultraviolet light to the chamber to produce the oxygen radicals which engage the patterns and decrease a line width of the photoresist patterns.

2. The method as recited in claim 1, wherein the oxygen radicals are formed by a thermal decomposition of an ozone gas in an ozone asher.

3. The method as recited in claim 2, wherein the thermal decomposition is carried out by ultraviolet-ray irradiation.

4. The method as recited in claim 3, the semiconductor substrate is heated by a heater block on which the semiconductor substrate is supported.

5. The method as recited in claim 1, the ashing step is carried out at atmosphere pressure.

6. The method as recited in claim 1, the stepper is a KrF-Excimer laser stepper.

7. The method as recited-in claim 2, the ozone gas in the ozone asher is present in a concentration ranging from about 5 vol % to about 7 vol %.

8. The method as recited in claim 3, the thermal decomposition of the ozone gas is carried out at a temperature ranging from about 130° C. to about 200° C.

9. The method as recited in claim 1, the photoresist patterns comprise a negative or a positive photoresist layer.

10. The method as recited in claim 1, a light source of the stepper is selected from the group consisting of g-line, i-line and ArF.

11. A method for forming fine photoresist patterns in a semiconductor device comprising the step of:

forming photoresist patterns over a semiconductor substrate using a stepper; and ashing the photoresist patterns using oxygen radicals in order to decrease line width of the photoresist patterns, the oxygen radicals being formed by ultraviolet radiation in an ozone asher having an ozone concentration ranging from about 5 vol % to about 7 Vol %, while heating the substrate and photoresist patterns.

12. The method as recited in claim 11, the semiconductor substrate is heated by a heater block on which the semiconductor substrate is supported.

13. The method as recited in claim 12, the ashing step is carried out at atmosphere pressure.

14. The method as recited in claim 13, the thermal decomposition of the ozone gas is carried out at a temperature ranging from about 130° C. to about 200° C.

15. The method as recited in claim 14, the photoresist patterns comprise a negative or a positive photoresist layer.

* * * * *